United States Patent [19]

Lubahn et al.

[11] Patent Number: 5,535,100
[45] Date of Patent: Jul. 9, 1996

[54] SNAP-TOGETHER/QUICK-RELEASE FASTENING ASSEMBLY FOR SUPPORTING A CIRCUIT CARD

[75] Inventors: Ken E. Lubahn, Byron; Jim A. Melville, Rochester, both of Minn.

[73] Assignee: International Business Machines Corporation, Armonk, N.Y.

[21] Appl. No.: 477,844

[22] Filed: Jun. 7, 1995

[51] Int. Cl.$^6$ ................................................ H05K 7/14
[52] U.S. Cl. ........................ 361/801; 361/752; 361/796; 361/798; 439/154
[58] Field of Search ........................ 361/752, 754, 361/756, 759, 796, 798, 801, 802; 174/50, 17 R; 439/154–159, 374, 377, 61, 325; 206/334; 403/16, 321, 322, 325, 330

[56] References Cited

U.S. PATENT DOCUMENTS

| | | |
|---|---|---|
| 4,568,134 | 2/1986 | DiMondi . |
| 4,925,400 | 5/1990 | Blair et al. . |
| 4,980,800 | 12/1990 | Furuta . |
| 5,006,951 | 4/1991 | Albert et al. ............................ 361/220 |
| 5,317,481 | 5/1994 | Hillis et al. ............................ 361/796 |
| 5,428,507 | 6/1995 | Chatel et al. .......................... 361/798 |

Primary Examiner—Gerald P. Tolin
Assistant Examiner—Y. Whang
Attorney, Agent, or Firm—Craig J. Yudell; Andrew J. Dillon

[57] ABSTRACT

A fastening assembly for mounting a main circuit card a fixedly spaced distance from a mounting wall, and for aligning a subsidiary connector of a subsidiary circuit card to a main connector mounted on a top surface of the main circuit card is provided. The fastening assemby comprises a pin and a support button. The pin has a bottom portion that passes through mounting apertures within a main connector mounted to a top surface of a main circuit card that extend from the center axis at most a first distance, and wherein the bottom portion extends from the center axis at least a second distance. The pin also has a shaft portion fixedly spaced above and co-axial with the bottom portion that has at least a narrow section of the shaft portion that extends from the center axis a distance less then the second distance such that a lip is formed by a side of the bottom portion where the bottom portion meets the shaft portion at the narrow section, and wherein at least a wide section of the shaft portion of the pin extends from the center axis at least the second distance. The pin also has an upper end with cross sectional area greater than the cross sectional area of the shaft portion and sized to pass through the mounting apertures. The upper end has a flange extending out from the center axis a distance greater than the first distance such that the flange encounters the main connector when the pin is inserted in the mounting apertures.

8 Claims, 5 Drawing Sheets

5,535,100

SNAP-TOGETHER/QUICK-RELEASE FASTENING ASSEMBLY FOR SUPPORTING A CIRCUIT CARD

BACKGROUND OF THE INVENTION

1. Technical Field

The present invention relates to fastening assemblies for mounting a main printed circuit board (PCBs) to an electronics cover, and to connector alignment for docking a subsidiary PCB.

2. Description of the Related Art

Often in PCB configurations, subsidiary PCBs (sometimes known as "daughter boards") are connected to a main PCB (sometimes called a "mother board"). The daughter board connectors are mounted directly on the top surface of the mother board so that a planer mother card has daughter cards that plug into it perpendicular to the card plane. This configuration is used to render the PCB configuration more compact, thereby shortening the circuit path in the apparatus and allowing the apparatus to operate at greater speed.

A perpendicular mother/daughter configuration requires that support be provided to the mother card during insertion or removal of the daughter cards to prevent over stressing of the planer card. In addition, a means of fastening the mother card within an electronics package must be provided that includes standoffs to insure clearance between the card and the electrically conductive covers. Also, during docking of a daughter card with the mother board, a means of guidance for the daughter card's connector must be provided to prevent damage to the connectors that might result from misaligned plugging of the daughter card into the mother board.

The prior art has detailed alignment features for connectors to allow accurate connection of daughter cards to mother boards. The prior art has also detailed mounting devices for mounting circuit cards to electronic packages or covers by utilizing some fastening means that includes fasteners. However, it would be desirable to provide an overall system for mounting circuit cards to covers that includes standoffs to separate the cards from the cover, connector alignment pins for aligning daughter cards during docking with a mother board, and to provide these functions by a simple, efficient and economical design that quickly and simply mounts and releases the circuit card from the electronics cover without requiring complicated assembly such as with fasteners, for example.

SUMMARY OF THE INVENTION

According to the present invention, a fastening assembly for mounting a main circuit card a fixedly spaced distance from a mounting wall, and for aligning a subsidiary connector of a subsidiary circuit card to a main connector mounted on a top surface of the main circuit card is provided. The fastening assembly comprises a pin and a support button.

The pin has a lower end and an upper end, both centered about a center axis. The lower end includes a bottom portion with a cross sectional area sized to pass through mounting apertures within the main connector and the main circuit card that extend from the center axis at most a first distance, and wherein the bottom portion extends from the center axis at least a second distance. The lower portion further has a shaft portion fixedly spaced above and co-axial with the bottom portion that has a reduced cross sectional area wherein at least a narrow section of the shaft portion extends from the center axis a distance less then the second distance such that a lip is formed by a side of the bottom portion where the bottom portion meets the shaft portion at the narrow section, and wherein at least a wide section of the shaft portion of the pin extends from the center axis at least the second distance. The upper end has a cross sectional area greater than the cross sectional area of the shaft portion and sized to pass through the mounting apertures. The upper end includes has a flange extending out from the center axis a distance greater than the first distance such that the flange encounters the main connector when the pin is inserted in the mounting apertures.

The support button has a head portion larger than the mounting apertures that contains a pin-receiving aperture along an axis. The support button has at least one locking spring arm With a flange at its end. The locking spring arm extends from the head along and parallel to the pin-receiving aperture and is adapted to be deflected toward the axis by a top surface of the mounting wall at the periphery of a mounting aperture in the mounting wall, thereby allowing the flange to pass through the mounting wall's mounting aperture. The flange has a locking surface that engages a bottom surface of the wall once the flange has passed through the mounting wall's mounting aperture to prohibit the flange from returning through the mounting wall's mounting aperture. Further, the support button has at least one retaining spring arm extending from the head at an angle downwardly into the pin-receiving aperture toward the axis. The retaining spring arm is adapted to be deflected away from the axis by the bottom portion of the pin upon insertion of the pin into the pin-receiving aperture and then engaging the lip to prevent the pin from returning through the pin-receiving aperture when the bottom portion has been inserted beyond the retaining spring arm. As will be appreciated, when the pin is rotated while the retaining spring arm is engaging the lip, the retaining spring arm is deflected by the wide section of the shaft portion away from the axis and is disengaged from the lip, thereupon allowing the pin to return through the pin-receiving aperture, unsnapping the fastening assembly.

In addition, a guide pin portion can be included, fixedly spaced above the flange, that is sized to be accommodated by a mounting lug attached to a subsidiary connector attached to a subsidiary circuit card, wherein insertion of the mounting lug into the guide pin provides alignment of the subsidiary connector with the main connector as the subsidiary card is being docked to the main card.

As can be seen, the pin and support button are configured as a snap-together fastening assembly that securely mounts the main circuit card a fixedly spaced distance from the mounting wall when the support button has been snapped into the mounting aperture of the mounting wall and the pin has been inserted through the main connector and main circuit card mounting apertures and snapped into the support button's pin-receiving aperture. Further, the fastening assembly has a quick release mechanism that allows the pin holding a main circuit card securely to the support button to be released, thereby dismounting the main circuit card from the mounting wall.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
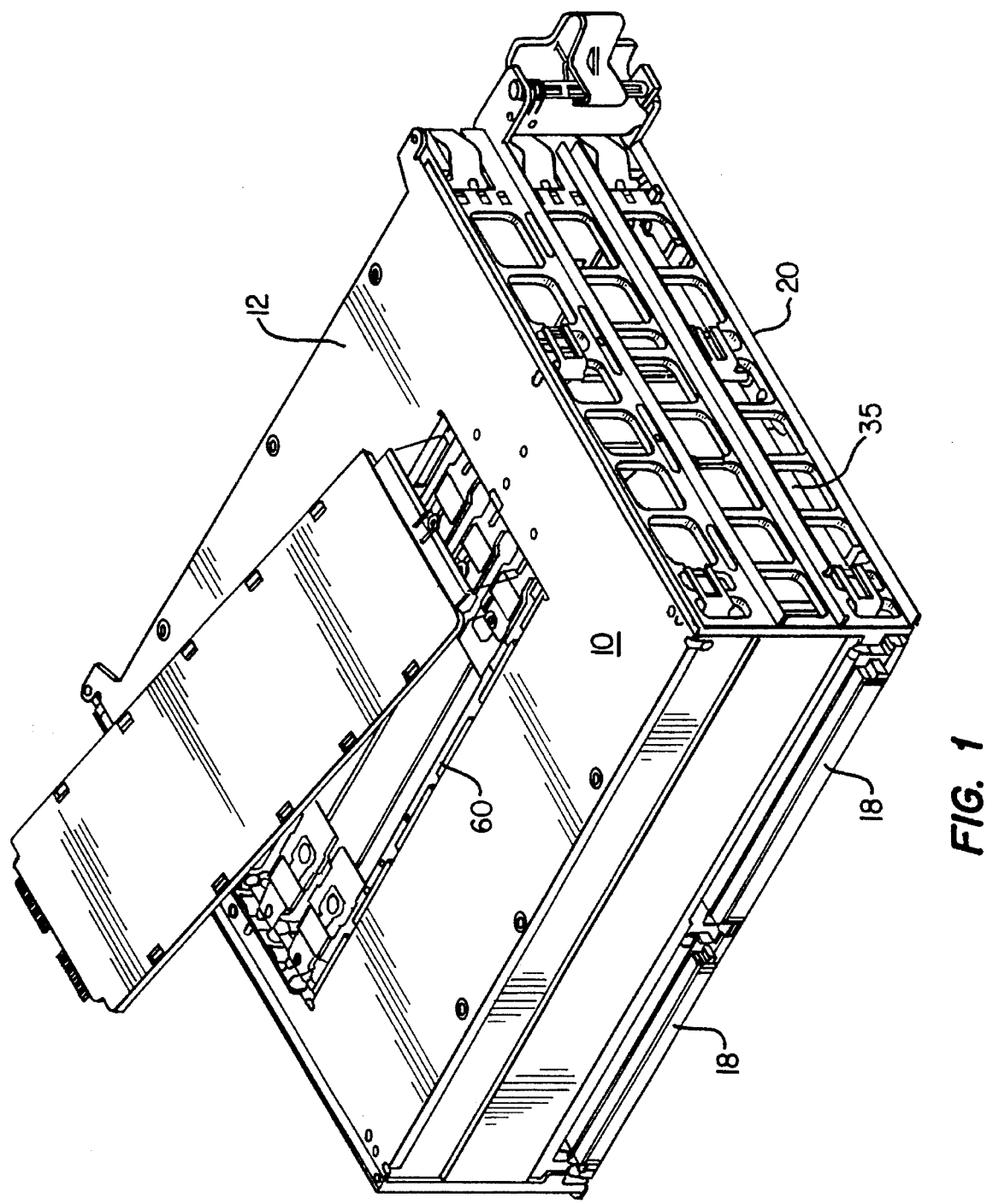
FIG. 1 depicts a rear perspective view of an electronics package.

With reference now to the figures and in particular with reference to FIG. 1, there is shown a rear perspective view of an electronics package. Package 10 has an enclosure formed by a top cover 12, a bottom cover 20, and a back 16. The enclosure is completed by brackets, which hold the covers 12, 20 fixedly spaced from each other.

Enclosed within package 10 is circuit card 35 and daughter card 60. Typically, such a circuit card would be a printed circuit board (PCB), as is well known by those skilled in the art, and would contain processor circuitry or memory expansion for a small computer, for example. Mounted on the edge of circuit card 35 are two connectors 18 positioned on the back for mating and connection with a system backplane when electronics package 10 is inserted into a card cage.

Figure 2:
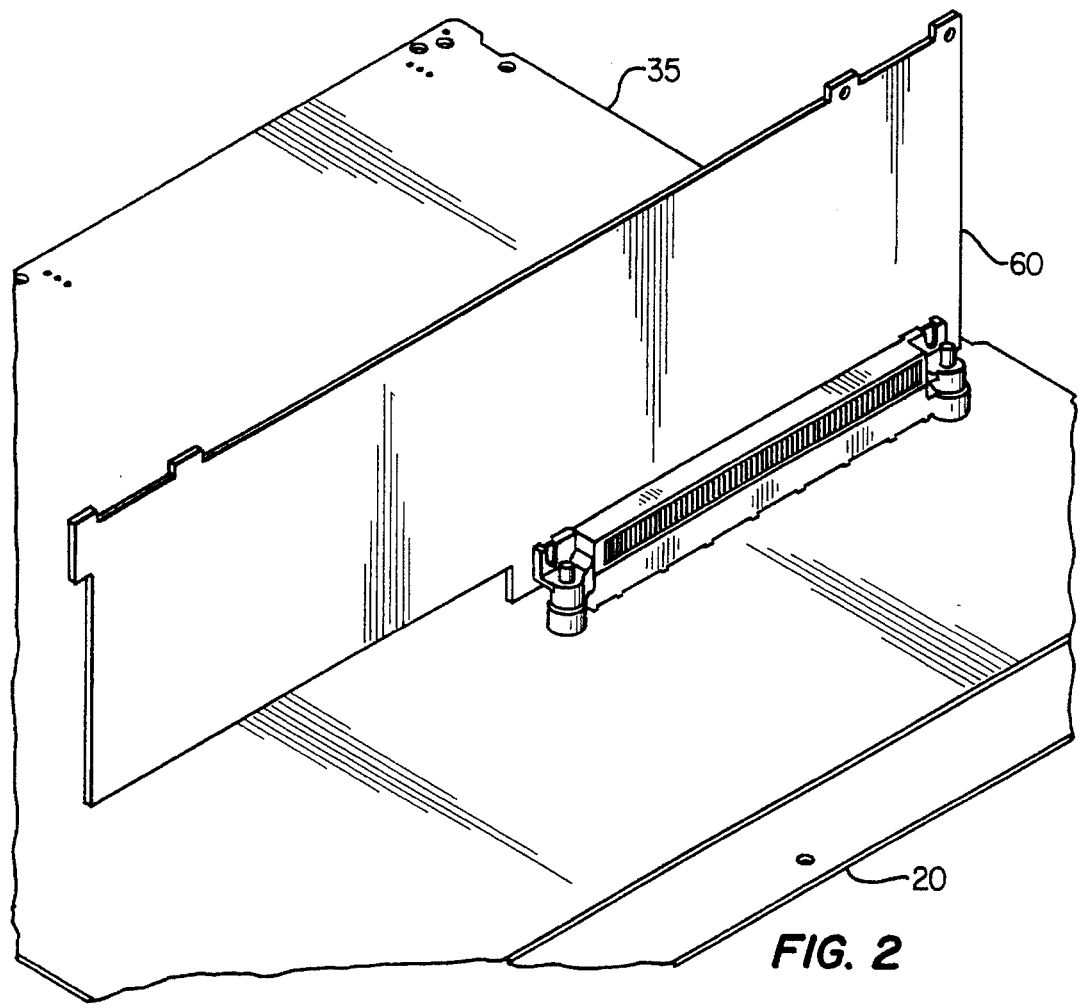
FIG. 2 depicts a mother/daughter circuit card configuration that is aligned and mounted utilizing an alignment pin and support button, in accordance with the preferred embodiment of the present invention.
Figure 3:
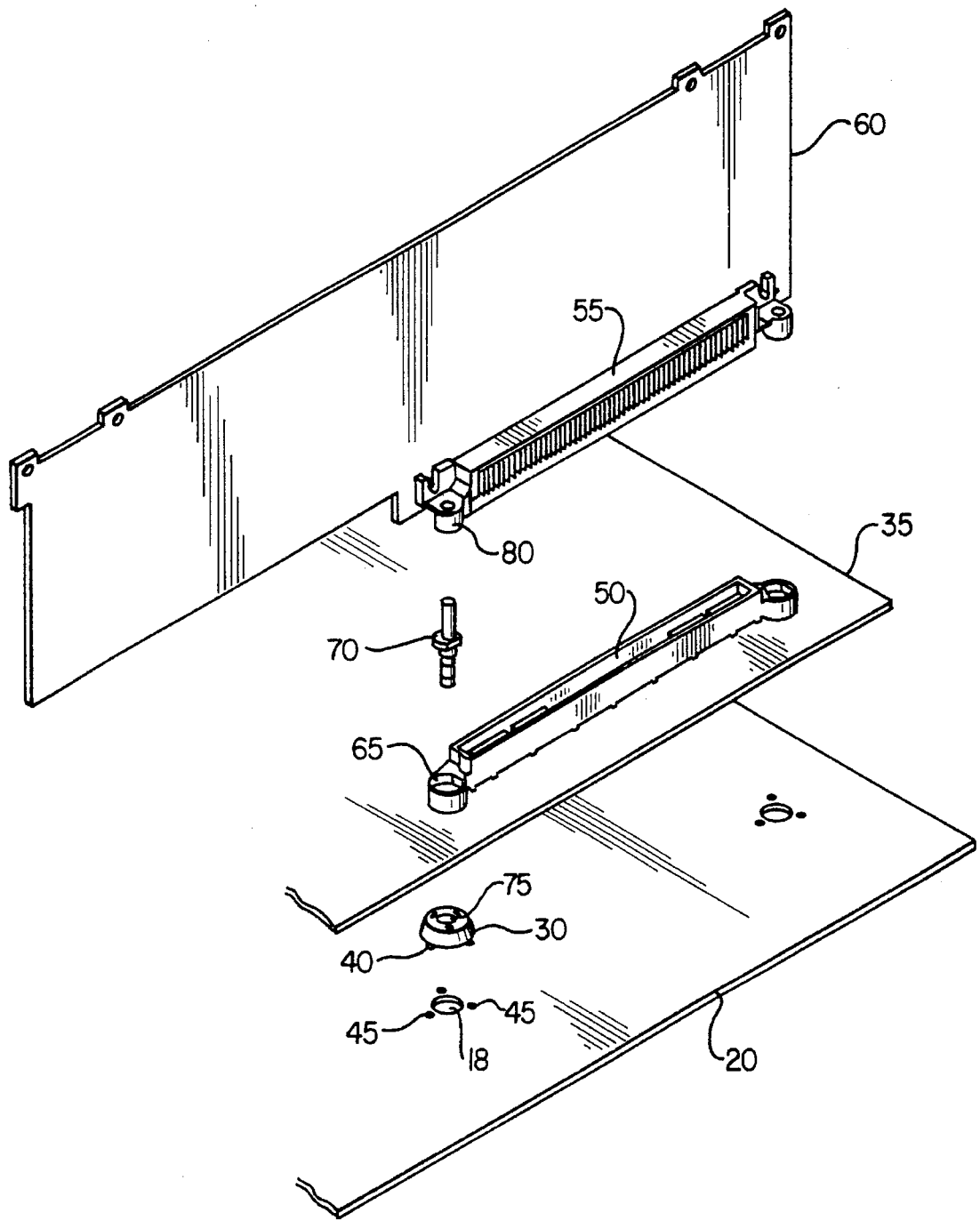
FIG. 3 shows an exploded view of the mother/daughter circuit card configuration that is aligned and mounted utilizing the fastening assembly of the present invention.
Figure 5A:
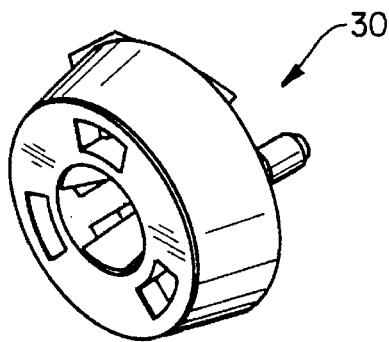
FIG. 5A depicts a top perspective view of the support button.
Figure 5B:
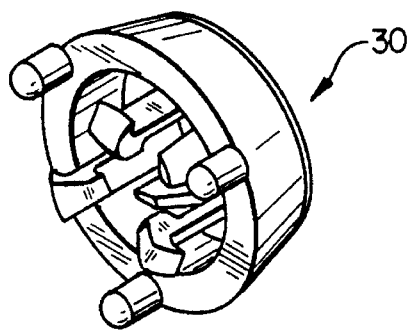
FIG. 5B depicts a bottom perspective view of the support button.
Figure 5C:
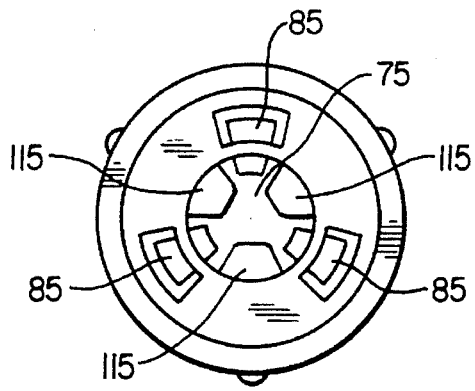
FIG. 5C depicts a top view of the support button.
Figure 5D:
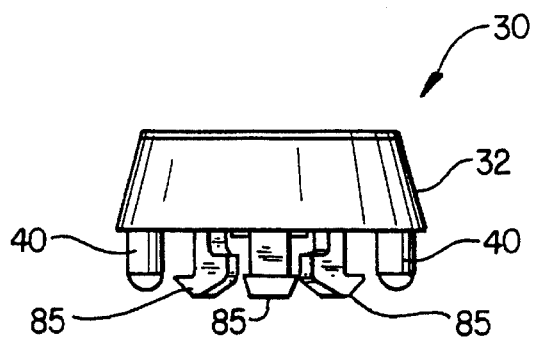
FIG. 5D shows a side view of the support button.
Figure 5F:
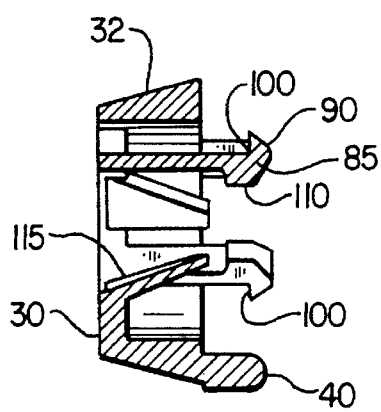
FIG. 5F shows a cross sectional view of the support button taken through line A—A in FIG. 5E.
Figure 5E:
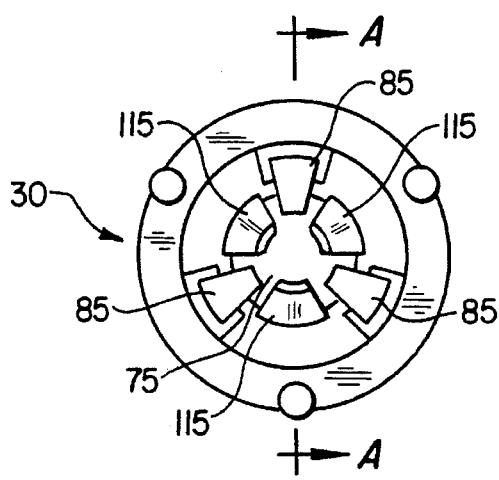
FIG. 5E shows a bottom view of the support button.
Figure 6A:
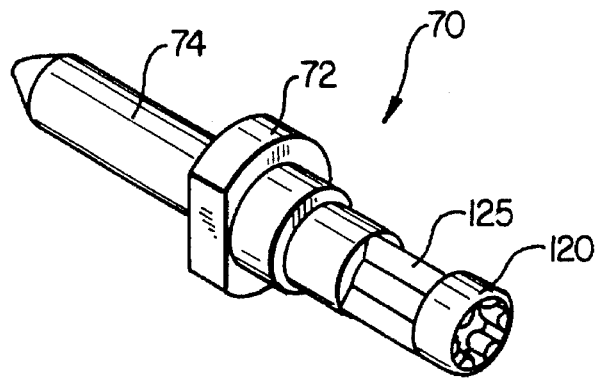
FIG. 6A shows a perspective view of the alignment pin.
Figure 6B:
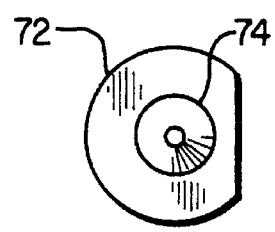
FIG. 6B shows a front view of the alignment pin.
Figure 6C:
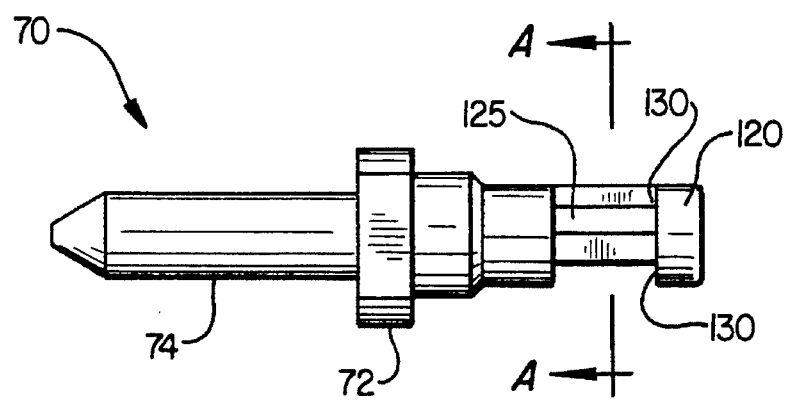
FIG. 6C depicts a side view of the alignment pin.
Figure 6F:
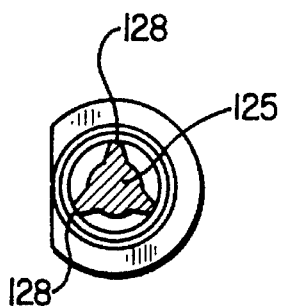
FIG. 6F shows a cross sectional view of the alignment pin taken through the line A—A in FIG. 6C.
Figure 6D:
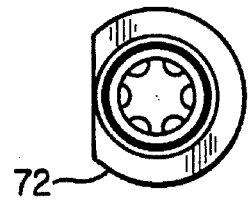
FIG. 6D shows a rear view of the alignment pin.

Referring now to FIG. 2, there is shown a mother/ daughter circuit card configuration that is aligned and mounted utilizing an alignment pin and support button, in accordance with a preferred embodiment of the present invention. FIG. 3 shows an exploded view of the mother/ daughter circuit card configuration of the present invention. A support button 30 snaps into a mounting aperture 18 in the bottom cover 20 of the electronics package and acts as a standoff for the planer mother circuit card 35. Each support button 30 has supporting legs 40 that insert into apertures 45 on cover 20 to properly align the support button 30 with the cover and mother board. Support button 30 prevents the bottom of mother card 35 from making contact with the electrically conductive cover 20 and causing a shorting of electronic circuitry. As will be appreciated, a plurality of support buttons 30 may be required to properly maintain mother card 35 at a standoff position from cover 20.

The mother board 35 has a connector 50 mounted to its top surface suitable for connection with a connector 55 mounted to daughter board 60. Connector 50 has mounting lug 65 that is aligned with support button 30. Once the mother board 35 has been supported by the support buttons 30, alignment pin 70 is pressed through the mounting lugs 65 and the mother card 35 to be inserted in the pin-receiving hole 75 in support button 30. The pin-receiving hole 75 of each support button 30 has plastic snap features that grip a mating alignment pin 70, as will be described in detail below.

The alignment pin 70 retains the mother card 35 in the correct location relative to cover 20 and resists forces from docking and removal of daughter card 60. The alignment pin 70 has a tapered nose at its tip 74 that engages the daughter card connector lug 80 during docking of the daughter card to the mother card. The tip 74 enters holes in the connector lug 80, providing an exact connector-to-connector alignment during docking. As will be appreciated by those skilled in the art, a second fastening assembly comprised of a support button 30 and an alignment pin 70 would be utilized to align a second set of connector lugs in connectors 50, 55 to provide correct alignment in the two dimensions of the top surface of mother board 35 during docking.

As will be appreciated by those skilled in the art, the fastening assembly of support button 30 and alignment pin 70 carries the loads of stress and strain produced from docking and removal of daughter cards from the mother card. As connector 55 is pressed or pulled from connector 50, the resultant forces are transferred through alignment pin 70 and support button 30 from connector 50 to cover 20. Therefore, the mother card 35 is not subjected to deforming forces that may cause the fracture or breakage of component pins or leads or copper traces.

Figure 4:
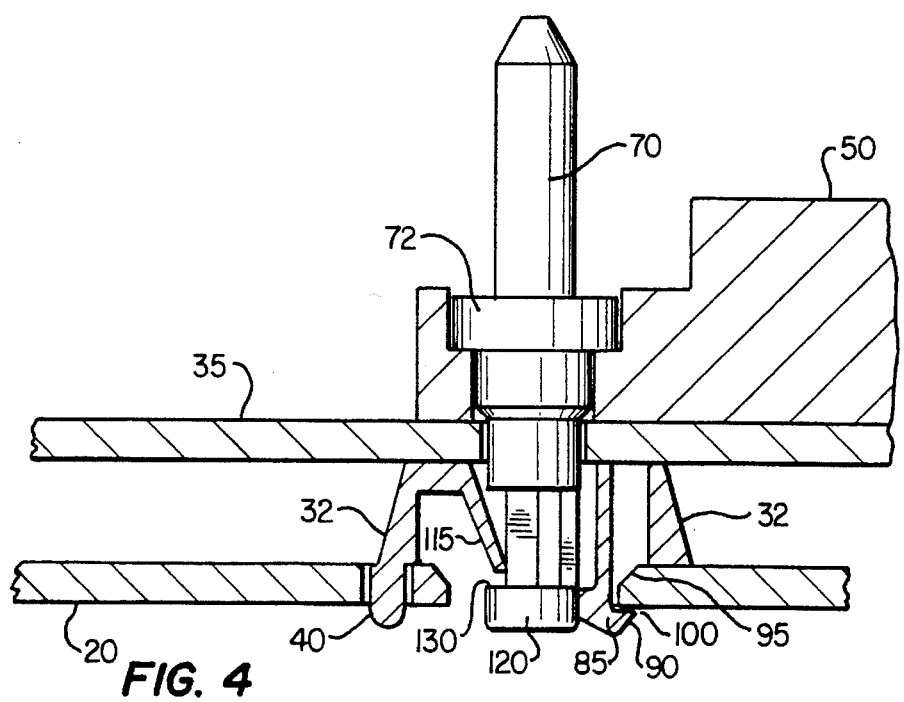
FIG. 4 depicts a cutaway side view of the fastening assembly mounting a mother board to a cover.

Referring now to FIG. 4, there is depicted a cutaway side view of the mother card 35 mounted to cover 20 by the support button 30 and alignment pin 70, in accordance with the preferred embodiment of the present invention. FIGS. 5A–5F show the details of button 30. Support button 30 includes locking snap 85 attached to a head portion 32. Prior to aligning and mounting mother board 35, support buttons 30 are snapped into cover 20 by first inserting legs 40 into holes 45. As legs 40 begin to enter holes 45, angled surface 90 on locking snap 85 encounters angled surface 95 on cover 20. Locking snap 85 is made of a thin, flexible material, such as nylon, and so locking snap 85 will bend away from surface 95 as mounting button 30 continues to be pushed down towards cover 20. Eventually, angled surface 90 will pass beyond angled surface 95 and the bottom surface of cover 20 and locking snap 85 snaps back from its flexed position. Surface 100 of locking snap 85 is then in contact with the bottom surface of cover 20 and prevents retraction of support button 30 from cover 20.

Support button 30 is even more securely mounted to cover 20 once alignment pin 70 is inserted in pin-receiving hole 75. As can be seen in FIG. 4, the side surface of the bottom portion 120 of alignment pin 70 prevents the flecture of locking snap 85 by abutting the side surface 110 of locking snap 85. By preventing the flecture of locking snap 85, surface 100 is forced to remain against cover 20, securely locking support button 30 to cover 20.

FIGS. 6A–6F depict alignment pin 70. Alignment pin 70 passes through the mounting lug on connector 50 and the mounting aperture in circuit card 35 until flange 72 engages the connector 50 and alignment pin 70 locks into pin-receiving hole 75 to lock mother board 35 to support button 30. Support button 30 includes an angled retaining snap 115. Retaining snap 115 is a thin, flexible tab that angles towards the center of pin-receiving hole 75. As the bottom portion 120 of alignment pin 70 enters into the pin-receiving hole 75, retaining snap 115 is deflected outwardly away from alignment pin 70 by bottom portion 120. Alignment pin 70 proceeds downwardly into the pin-receiving hole 75, where, eventually, retaining snap 115 encounters shaft portion 125 having a surface closer to the center axis of alignment pin 70 than the outer surface of bottom portion 120. There, retaining snap 115 snaps back from its deflected position. As can be seen from FIG. 6F, shaft 125 has a triangular shape, and as can be seen from FIG. 6D, bottom portion 120 has a circular shape. At the juncture of bottom portion 120 and shaft 125, three lips 130 are formed. As will be appreciated, if alignment pin 70 is retracted from pin-receiving hole 75, retaining snap 115 will encounter lip 130, which will prevent alignment pin 70 from being retracted. As can be seen, support button 30 and alignment pin 70 are designed to form a fastening assembly that firmly mounts mother board 35 to cover 20.

While shaft 125 is disclosed as having a triangular shaped cross section, it will be understood that the shaft can have other geometric shapes for a cross sectional area. For example, shaft 125 may have a box shaped or circular shaped cross section, as long as a lip 130 is formed by the side of the bottom portion 120 where the bottom portion meets the shaft.

An additional feature of the present invention is the quick-release capability of the alignment pin 70 and support button 30. If it is desired to release the fastening assembly, alignment pin 70 is turned within pin-receiving hole 75 approximately ⅓ of a turn such that retaining snap 115 is cammed by shaft 125 until retaining snap 115 is deflected by tips 128 of shaft 125 so that it is deflected away from the center axis of alignment pin 70 and no longer encounters lip 130. The bottom portion 130 has a hole suitable for receiving a "star" head screwdriver for facilitating the rotation of alignment pin 70 to release the fastening assembly.

In summary, the present invention provides a device which accomplishes card mounting, connector guidance, and quick-release all in one fastening assembly having a simple snap-together design, allowing for easy and economical manufacture. The support buttons provide standoff support, which isolates the mother board from the conductive cover of an electronics package and provides anchor points that support the main circuit card immediately adjacent to the connectors and close to the point of application of the docking forces to reduce the forces being exerted on the mother board. This minimizes excessive deflection and overloading of the mother board during docking that may cause fracture or breakage of solder pads, leads, and traces on the main circuit card. In addition, the assembly includes alignment pins for aligning the daughter board connector during docking of the daughter board. Still further, the mounting and guidance components snap together to lock the circuit card to the cover, while providing a quick-release for disconnecting the fastening assembly without requiring special tools. This feature facilitates initial assembly of the parts and ease of disassembly during servicing or replacing of the circuit cards.

While the invention has been particularly shown and described with reference to a preferred embodiment, it will be understood by those skilled in the art that various changes in form and detail may be made therein without departing from the spirit and scope of the invention.

What is claimed is:

1. A fastening assembly for mounting a main circuit card a fixedly spaced distance from a mounting wall, comprising:

a pin having a lower end and an upper end, both centered about a center axis, the lower end having a bottom portion with a cross sectional area sized to pass through mounting apertures within the main circuit card and a main connector mounted to a top surface of the main circuit card that extend from the center axis at most a first distance, and wherein the bottom portion extends from the center axis at least a second distance, and further having a shaft portion fixedly spaced above and co-axial with the bottom portion that has a reduced cross sectional area such that at least a section of the shaft portion extends from the center axis a distance less then the second distance and such that a lip is formed by a side of the bottom portion where the bottom portion meets the shaft portion at the section, the upper end having a cross sectional area greater than the cross sectional area of the shaft portion and sized to pass through the mounting apertures, and the upper end including a flange extending out from the center axis a distance greater than the first distance such that the flange encounters the main connector when the pin is inserted in the mounting apertures; and a support button having a head portion larger than the mounting apertures that contains a pin-receiving aperture centered about an axis, and having at least one locking spring arm with a flange at its end, the locking spring arm extending from the head along and parallel to the pin-receiving aperture and being adapted to be deflected toward the axis by a top surface of the mounting wall at the periphery of a mounting aperture in the mounting wall, thereby allowing the flange to pass through the mounting wall's mounting aperture, the flange having a locking surface that engages a bottom surface of the wall once the flange has passed through the mounting wall's mounting aperture to prohibit the flange from returning through the mounting wall's mounting aperture, and further wherein the support button has at least one retaining spring arm extending from the head at an angle downwardly into the pin-receiving aperture toward the axis, the retaining spring arm being adapted to be deflected away from the axis by the bottom portion of the pin upon insertion of the pin into the pin-receiving aperture and then engaging the lip to prevent the pin from returning through the pin-receiving aperture when the bottom portion has been inserted beyond the retaining spring arm;

wherein the pin and support button are thereby configured as a fastening assembly that securely mounts the main circuit card a fixedly spaced distance from the mounting wall when the support button has been snapped into the mounting aperture of the mounting wall and the pin has been inserted through the main connector and main circuit card mounting apertures and snapped into the support button's pin-receiving aperture.

2. A fastening assembly according to claim 1, wherein the pin further includes a guide pin portion, fixedly spaced above the flange, sized to be accommodated by a mounting lug attached to a subsidiary connector attached to a subsidiary circuit card, wherein insertion of the mounting lug into the guide pin provides alignment of the subsidiary connector with the main connector as the subsidiary circuit card is being docked to the main circuit card.

3. A fastening assembly according to claim 1, wherein at least a wide section of the shaft portion of the pin extends from the center axis at least the second distance such that, whereupon the pin is rotated while configured as part of a fastening assembly, the retaining spring arm is deflected by the wide section away from the axis and is disengaged from the lip, thereupon allowing the pin to return through the pin-receiving aperture.

4. A fastening assembly according to claim 1, further comprising a retaining leg extending from the bottom of the support button that is received by a hole in the mounting wall to prevent the support button from rotating about the mounting wall's mounting aperture.

5. A fastening assembly for mounting a main circuit card a fixedly spaced distance from a mounting wall a mounting wall, comprising:

a pin having a lower end and an upper end, both centered about a center axis, the lower end having a bottom portion with a cross sectional area sized to pass through mounting apertures within the main circuit card and a main connector mounted to a top surface of the main circuit card that extend from the center axis at most a first distance, and wherein the bottom portion extends from the center axis at least a second distance, and further having a shaft portion fixedly spaced above and co-axial with the bottom portion that has a reduced cross sectional area such that at least a narrow section of the shaft portion extends from the center axis a distance less then the second distance and such that a lip is formed by a side of the bottom portion where the bottom portion meets the shaft portion at the narrow section, the upper end having a cross sectional area greater than the cross sectional area of the shaft portion and sized to pass through the mounting apertures, and the upper end including a flange extending out from the center axis a distance greater than the first distance such that the flange encounters the main connector when the pin is inserted in the mounting apertures; and a support button connected to the mounting wall and having a head portion larger than the mounting apertures that contains a pin-receiving aperture centered about an axis, and wherein the support button has at least one retaining spring arm extending from the head at an angle downwardly into the pin-receiving aperture toward the axis, the retaining spring arm being adapted to be deflected away from the axis by the bottom portion of the pin upon insertion of the pin into the pin-receiving aperture and then engaging the lip to prevent the pin from returning through the pin-receiving aperture when the bottom portion has been inserted beyond the retaining spring arm, and wherein at least a wide section of the shaft portion of the pin extends from the center axis at least the second distance such that, whereupon the pin is rotated while the retaining spring arm is engaging the lip, the retaining spring arm is deflected by the wide section away from the axis and is disengaged from the lip, thereupon allowing the pin to return through the pin-receiving aperture;

wherein the pin and support button are thereby configured as a fastening assembly that securely mounts the main circuit card a fixedly spaced distance from the mounting wall when the pin has been inserted through the main connector and main circuit card mounting apertures and snapped into the support button's pin-receiving aperture.

6. A fastening assembly according to claim 5, wherein the pin further includes a guide pin portion, fixedly spaced above the flange, sized to be accommodated by a mounting lug attached to a subsidiary connector attached to a subsidiary circuit card, wherein insertion of the mounting lug into the guide pin provides alignment of the subsidiary connector with the main connector as the subsidiary circuit card is being docked to the main circuit card.

7. A fastening assembly according to claim 5, wherein the support button further comprises at least one locking spring arm with a flange at its end, the locking spring arm extending from the head along and parallel to the pin-receiving aperture and being adapted to be deflected toward the axis by a top surface of the mounting wall at the periphery of a mounting aperture in the mounting wall, thereby allowing the flange to pass through the mounting wall's mounting aperture, the flange having a locking surface that engages a bottom surface of the wall once the flange has passed through the mounting wall's mounting aperture to prohibit the flange from returning through the mounting wall's mounting aperture.

8. A fastening assembly according to claim 5, further comprising a retaining leg extending from the bottom of the support button that is received by a hole in the mounting wall to prevent the support button from rotating about the mounting wall's mounting aperture.

* * * * *